(12) United States Patent
Andresakis et al.

(10) Patent No.: US 6,495,244 B1
(45) Date of Patent: Dec. 17, 2002

(54) MANUFACTURING FIRE RETARDANT CIRCUIT BOARDS WITHOUT THE USE OF FIRE RETARDANT RESIN ADDITIVES

(75) Inventors: John A. Andresakis, Clifton Park, NY (US); Dave Paturel, San Marino, CA (US)

(73) Assignee: Oak-Mitsui, Inc., Hoosick Falls, NY (US)

( * ) Notice: Subject to any disclaimer, the term of this patent is extended or adjusted under 35 U.S.C. 154(b) by 174 days.

(21) Appl. No.: 09/656,489

(22) Filed: Sep. 7, 2000

(51) Int. Cl.$^7$ ................................................. B32B 3/00
(52) U.S. Cl. ........................ 428/209; 428/325; 428/901; 174/258; 174/259
(58) Field of Search .................. 428/209, 901, 428/325; 174/250, 255, 258, 259

(56) References Cited

U.S. PATENT DOCUMENTS

| | | | |
|---|---|---|---|
| 3,527,665 A | | 9/1970 | Wright et al. .................. 161/92 |
| 5,098,781 A | * | 3/1992 | Minnick et al. .......... 428/313.5 |
| 5,103,293 A | * | 4/1992 | Bonafino et al. ............ 174/256 |
| 5,229,192 A | * | 7/1993 | Kober et al. ................. 428/209 |
| 5,496,613 A | * | 3/1996 | Middelman et al. ......... 428/105 |
| 5,498,471 A | * | 3/1996 | Hausdorf et al. ............ 428/283 |
| 5,571,609 A | * | 11/1996 | St. Lawrence et al. ...... 428/268 |
| 5,587,243 A | * | 12/1996 | von Gentzkow et al. ... 428/413 |
| 5,686,172 A | * | 11/1997 | Ohya et al. .................. 428/210 |
| 5,707,749 A | | 1/1998 | Katagiri et al. .......... 428/473.5 |
| 5,766,386 A | * | 6/1998 | Sakai et al. ................. 156/62.2 |
| 5,879,794 A | * | 3/1999 | Korleski, Jr. ............. 428/317.1 |
| 6,015,872 A | * | 1/2000 | Kawakita et al. ............ 428/901 |
| 6,071,836 A | | 6/2000 | St. Lawrence et al. ...... 442/237 |
| 6,214,455 B1 | * | 4/2001 | Honda et al. ............. 428/299.4 |

FOREIGN PATENT DOCUMENTS

| | | |
|---|---|---|
| DE | 199 52 246 A1 | 5/2000 |
| GB | 2 057 351 A | 4/1981 |
| JP | 11343398 | 12/1919 |
| JP | 10195178 | 7/1998 |
| JP | 6240214 | 9/1999 |
| WO | WO 99/00451 | 1/1999 |

* cited by examiner

*Primary Examiner*—Cathy Lam
(74) *Attorney, Agent, or Firm*—Richard S. Roberts, LLP

(57) ABSTRACT

This invention relates to printed circuit boards having improved fire resistance and improved environmental stability. The invention provides halogen-free fire retardant printed circuit boards incorporating potentially flammable polymers. Flame resistant thermoplastic layers prevent combustion of thermosetting polymers, as well as adding strength to the laminate, resulting in a less brittle thin core than the prior art. The flame resistant circuit board is cost efficient, environmentally safe and has excellent properties, including a decreased probability of shorting, good dielectric breakdown voltage, a smooth surface and good electrical/thermal performance.

33 Claims, No Drawings

MANUFACTURING FIRE RETARDANT CIRCUIT BOARDS WITHOUT THE USE OF FIRE RETARDANT RESIN ADDITIVES

BACKGROUND OF THE INVENTION

1. Field of the Invention

This invention relates to printed circuit boards having improved fire resistance and improved environmental stability. More particularly, the invention relates to halogen-free fire retardant printed circuit boards incorporating potentially flammable polymers.

2. Description of the Related Art

Printed circuit boards are employed in a wide variety of applications. For example, they can be found inside radio and television sets, telephone systems, automobile dashboards and computers. They also play an important role in the operation of airborne electronic equipment and guided missiles. In forming insulating dielectric materials for printed circuit boards, it is common to employ organic polymer films that may be flammable under certain circumstances.

To combat this problem, fire retardant halogen additives are commonly employed. The purpose of the halogens is to attain an acceptable flammability rating as determined by Underwriters Laboratory (UL) 94V0 or 94V1 flammability tests, for most standard resins. For example, Japanese abstract JP6240214 provides a copper-clad laminate having a copper foil coated with a flame-retardant adhesive. The flame-retardant adhesive comprises a poly(vinyl acetal) resin, epoxy resin, polyisocyanate resin, and brominated polyester resin. U.S. Pat. No. 6,071,836 discloses polybutadiene and polyisoprene thermosetting compositions having a bromine-containing fire retardant. However, these additives are very expensive and interfere with the physical and electrical properties of the polymer. Also, decomposition of dielectric materials having halogen additives produces carcinogenic materials such as furan and dioxins.

In order to minimize the impact on the environment of electronic materials, many countries are requiring the substrates used in circuit boards to be halogen-free. For example, Japanese abstract JP11343398 provides a laminate and metal foil utilizing a flame retardant epoxy resin composition. This flame retardant composition comprises an epoxy resin, a hardener and an additive, wherein at least one incorporated hardener comprises a polycondensate of phenols, a compound having a triazine ring and aldehydes, and an inorganic filler as an additive. Also, Japanese abstract JP10195178 discloses a halogen-free flame-retardant composition comprising a bisphenol A epoxy resin, a novolac epoxy resin, a phenolic resin curing agent, a cure accelerator and an inorganic filler. U.S. Pat. No. 5,082,727 teaches a flameproof product wherein the flameproofing agents are a combination of organic borates, salts of phosphoric acids and oxide hydrates of magnesium and/or of aluminum. However, these alternatives are also very expensive and do not have good peel strengths to foil conductors.

It has therefore been desirable to provide an affordable, non-flammable, halogen-free dielectric composition for printed circuit boards having good properties and performance. The present invention offers a solution to this problem, providing a method by which copper foils are coated with non-halogenated thermoplastic dielectric layers and thermosetting polymer layers.

In particular, a printed circuit board is provided comprising a substrate having opposite surfaces, a thermosetting polymer layer on each of the opposite substrate surfaces, a thermoplastic dielectric layer on each of the thermosetting polymer layers, and an electrically conductive layer on each of the thermoplastic dielectric layers. The thermosetting layers may have various degrees of flammability, but the thermoplastic layers are inherently flame resistant and prevent combustion of the thermosetting polymers. The thermoplastic dielectric also adds strength to the laminate, resulting in a less brittle thin core than the prior art. The result is a cost efficient, environmentally safe and flame resistant laminate having excellent properties, including a decreased probability of shorting, good dielectric breakdown voltage, a smooth surface and good electrical/thermal performance.

SUMMARY OF THE INVENTION

The invention provides a circuit board comprising in order:

a) a planar substrate having opposite surfaces;

b) a thermosetting polymer layer on each of the opposite substrate surfaces;

c) a thermoplastic dielectric layer on each of the thermosetting polymer layers; and d) an electrically conductive layer on each of the thermoplastic dielectric layers.

The invention also provides a process for manufacturing a printed circuit board comprising:

a) depositing a thermosetting polymer layer onto opposite surfaces of a substrate;

b) depositing a thermoplastic dielectric layer onto each of the thermosetting polymer layers; and c) depositing an electrically conductive layer onto each of the thermoplastic dielectric layers.

DETAILED DESCRIPTION OF THE PREFERRED EMBODIMENTS

The invention provides a halogen-free, fire retardant printed circuit board.

The first step in the process of the invention is to deposit a thermosetting polymer layer onto opposite surfaces of a planar substrate. Typical substrates are those suitable to be processed into an integrated circuit or other microelectronic device. Suitable substrates for the present invention non-exclusively include non-halogenated materials such as fiberglass, aramid (Kevlar), aramid paper (Thermount), polybenzoxolate paper or combinations thereof. Of these, fiberglass is the most preferred substrate. Also suitable are semiconductor materials such as gallium arsenide (GaAs), silicon and compositions containing silicon such as crystalline silicon, polysilicon, amorphous silicon, epitaxial silicon, and silicon dioxide ($SiO_2$) and mixtures thereof. The preferred thickness of the substrate is of from about 10 to about 200 microns, more preferably from about 10 to about 100 microns. In a preferred embodiment of this invention, the substrate of the printed circuit board may comprise a plurality of adjacent strata including the strata of the above substrate materials, forming a complex multilayered article. In this embodiment, each stratum is attached to an adjacent stratum by a thermosetting polymer layer.

The thermosetting polymer layers are preferably deposited onto the substrate as liquids by coating, evaporation or vapor deposition to allow for control and uniformity of the polymer thickness. The liquid layers may subsequently be partially or fully cured on the substrate, thus forming a prepreg. For the purposes of this invention, an A-staged prepreg comprises a substrate having uncured thermosetting polymer thereon, a B-staged prepreg incorporates a partially cured thermosetting polymer, and a C-staged prepreg has a fully cured polymer. The most preferred prepreg for use in this invention is a B-staged, partially cured prepreg. Curing is conducted by placing the prepreg into an oven to evaporate any solvent from the polymer and either partially or fully cure the layers. Such may be done by subjecting the prepreg to a temperature of from about 100° F. to about 600° F., for about 1 to about 10 minutes. After curing is completed, the prepreg is removed from the oven and cooled.

The thermosetting polymer layers may also be deposited in the form of liquids or sheets that are laminated onto opposite sides of the substrate. Lamination is preferably conducted in a press at a minimum of about 275° C., for about 30 minutes. Preferably, the press is under a vacuum of at least 28 inches of mercury, and maintained at a pressure of about 150 psi. The thermosetting polymer layers preferably comprise non-halogenated materials such as epoxies, bis-malimide triazine epoxies, thermosetting polyimides, cyanate esters, allylated polyphenylene ethers, benzocyclobutenes, phenolics and combinations thereof. Of these epoxies and polyimides are preferred. Preferably, the thermosetting polymer layers have a thickness of from about 5 to about 200 microns, more preferably from about 2 to about 100 microns.

Next, thermoplastic dielectric layers are deposited onto each of the thermosetting polymer layers or onto the conductive layers. The thermoplastic dielectric layers may be deposited in the form of liquids or sheets that are laminated onto each thermosetting polymer layer, under conditions similar to those for lamination of the thermosetting layers. Preferably, the thermoplastic dielectric layers are deposited onto the thermosetting layers as liquids by coating, evaporation or vapor deposition, allowing for control and uniformity of the polymer thickness. The thermoplastic dielectric layers preferably comprise a substantially non-flammable material as determined by the UL94V0 test. These materials preferably include polyimides, polyesters, polyester containing co-polymers, polyarylene ethers, liquid crystal polymers, polyphenylene ethers, amines, and combinations thereof. Of these, polyimides are the most preferred. Polyimides are preferred because they have high electrical strengths, good insulating properties, a high softening point and are inert to many chemicals. Preferred are polyimides having a glass transition temperature (Tg) of from about 160° C. to about 320° C., with a glass transition temperature of from about 190° C. to about 270° C. being preferred. Preferably, the thermoplastic dielectric layers have a thickness of from about 5 to about 200 microns, more preferably from about 2 to about 100 microns.

The thermoplastic dielectric liquids will typically have a viscosity ranging from about 5,000 to about 35,000 centipoise with a preferred viscosity in the range of 15,000 to 27,000 centipoise. The polymer liquids will each comprise a solution including from about 10 to about 60% and preferably 15 to 30 wt % polymer with the remaining portion of the solution comprising one or more solvents. It is preferred that a single solvent be used in each polymer solution. Useful solvents include acetone, methyl-ethyl ketone, N-methyl pyrrolidone, and mixtures thereof. A most preferred single solvent is N-methyl pyrrolidone.

Either one or both of the thermosetting and thermoplastic polymers may also optionally comprise a filler material. Preferred fillers non-exclusively include ceramics, boron nitride, silica, barium titanate, strontium titanate, barium strontium titanate, quartz, glass beads (micro-spheres), aluminum oxide, nonceramic fillers and combinations thereof. If incorporated, a filler is preferably present in the thermoplastic dielectric polymer or thermosetting polymer in an amount of from about 5% to about 80% by weight of the each polymer, more preferably from about 10% to about 50% by weight of the each polymer. The percent of total polymer to the substrate material and to fillers may have a strong effect on flammability of the circuit board. Generally, the less the amount of thermosetting polymer present in the circuit board, the less flammable the circuit board will be.

The ratio of the thermoplastic dielectric to the thermosetting dielectric is important to obtain a fire resistant circuit board having good properties. Preferably, the weight ratio of the thermoplastic dielectric to the thermosetting dielectric is from about 1:0.5 to about 1:15, and more preferably from about 1:1 to about 1:8.

After the thermoplastic dielectric layers have been deposited onto the thermosetting polymer layers and/or the electrically conductive layers the materials are laminated together to form a metallic clad substrate. Each conductive layer may comprise either the same metal or may comprise different metals. The conductive layers preferably comprise foils and preferably comprise a material such as copper, zinc, brass, chrome, nickel, aluminum, stainless steel, iron, gold, silver, titanium and combinations and alloys thereof. Most preferably, the conductive layers comprise a copper foil. At least one of the electrically conductive foils may also comprise a part of an electrical circuit.

The conductive layers preferably have a thickness of from about 0.5 to about 200 microns, more preferably from about 9 to about 70 microns. The conductive materials used in the flexible composites of this invention may be manufactured with a shiny side surface and a matte surface. Examples of such conductive materials are disclosed in U.S. Pat. No. 5,679,230, which is incorporated herein by reference. The conductive layers may be applied using any well known method of metal deposition such as electrolytic or electroless deposition, coating, sputtering, evaporation or by lamination onto the thermoplastic layer.

After the circuit board is formed, it may then be selectively etched using well known photolithographic techniques using a photoresist composition. First, a photoresist is deposited directly onto the conductive layer. The photoresist composition may be positive working or negative working and is generally commercially available. Suitable positive working photoresists are well known in the art and may comprise an o-quinone diazide radiation sensitizer. The oquinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolac. Suitable positive photodielectric resins may be obtained commercially, for example, under the trade name of AZ-P4620 from Clariant Corporation of Somerville, N.J. as well as Shipley I-line photoresist. Negative photoresists are also widely commercially available.

The photoresist is then imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent.

Subsequently, the conductive layer is etched by well known etching techniques. The circuit board may then be rinsed and dried. After the circuit lines and spaces are etched through the metal layer and the conductive layer, the remaining photoresist may be removed from the metal layer surface either by stripping with a suitable solvent or by ashing by well known ashing techniques.

It is preferred that each of the substrate, thermosetting polymer layers, thermoplastic dielectric layers and electrically conductive layers are absent, i.e. free of halogen containing fire retardant additives. More particularly, it is preferred that each of these constituents are absent, i.e. free of bromine containing fire retardant additives. As a result, the fire resistant printed circuits formed by this invention are more environmentally safe than those of the prior art.

The following non-limiting examples serve to illustrate the invention.

EXAMPLE 1

An electrodeposited copper foil of about 12 to about 35 microns is coated with about 12 microns of a crosslinked thermoplastic polyimide. A fiberglass cloth is impregnated with a non-halogenated thermosetting polyimide (such as Keramid 601), forming a prepreg. The polymer is then partially cured. The thickness of this prepreg is about 68 microns. A copper foil is then laminated to the prepreg with the polymer coating facing the prepreg. The lamination is done under a vacuum (28 inches of Hg) at 275° C., with 200 psi of pressure for 90 minutes. The resulting laminate has a dielectric thickness of approximately 90 microns and passes the UL94V0 test for flammability.

EXAMPLE 2

Example 1 is repeated except a non-halogenated epoxy replaces the thermosetting polyimide. The lamination temperature is reduced to 185° C. and the time is reduced to 60 minutes. The resulting laminate passes the UL94V0 test for flammability.

EXAMPLE 3

Example 1 is repeated except the substrate is another fiberglass and the prepreg thickness is about 115 microns. The resulting product has a dielectric thickness of about 135 microns and a rating of UL94V1.

EXAMPLE 4

Example 3 is repeated except boron nitride is incorporated into the thermosetting resin to the level of 30% by volume. The resulting product has a rating of UL94V0.

EXAMPLE 5

Example 4 is repeated except an epoxy resin is substituted for the thermosetting polyimide and lamination parameters adjusted as per Example 2. The resulting product has a rating of UL94V0.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. A circuit board comprising in order:
   a) a planar substrate having opposite surfaces;
   b) a thermosetting polymer layer on each of the opposite substrate surfaces;
   c) a thermoplastic dielectric layer on each of the thermosetting polymer layers; and
   d) an electrically conductive layer on each of the thermoplastic dielectric layers wherein the thermoplastic dielectric layers comprise a material selected from the group consisting of polyesters, polyester containing copolymers, polyarylene ethers, polyimides, liquid crystal polymers, amines, and combinations thereof.

2. The circuit board of claim 1 wherein the thermosetting polymer layer is attached to each of the opposite substrate surfaces; the thermoplastic dielectric layer is attached to each of the thermosetting polymer layers; and the electrically conductive layer is attached to each of the thermoplastic dielectric layers.

3. The circuit board of claim 1 wherein the substrate, thermosetting polymer layers, thermoplastic dielectric layers and electrically conductive layers are absent of halogenated fire retardant additives.

4. The circuit board of claim 1 wherein the substrate, thermosetting polymer layers, thermoplastic dielectric layers and electrically conductive layers are absent of bromine containing fire retardant additives.

5. The circuit board of claim 1 wherein the electrically conductive foils comprise a material selected from the group consisting of copper, zinc, brass, chrome, nickel, aluminum, stainless steel, iron, gold, silver, titanium and combinations thereof.

6. The circuit board of claim 1 wherein the thermoplastic dielectric layers comprise a polymide.

7. The circuit board of claim 1 wherein the thermosetting polymer layers comprise a material selected from the group consisting of non-halogenated epoxies, bis-maleimide triazine epoxies, thermosetting polyimides, cyanate esters, allylated polyphenylene ethers, benzocyclobutenes, phenolics and combinations thereof.

8. The circuit board of claim 1 wherein the thermoplastic dielectric layer comprises a substantially non-flammable material as determined by the UL94V0 test.

9. The circuit board of claim 1 wherein the composition of at least one of the thermoplastic or thermosetting layers is comprised of a filler wherein the filler is selected from the group consisting of ceramics, nonceramics and combinations thereof.

10. The circuit board of claim 1 wherein the composition of at least one of the thermoplastic or thermosetting layers is comprised of a filler wherein the filler comprises from about 10% to about 80% by weight of the layer.

11. The circuit board of claim 1 wherein each of the thermoplastic and thermosetting layers have a thickness of from about 5 to about 200 microns.

12. The circuit board of claim 1 wherein the weight ratio of the thermoplastic dielectric layer to the thermosetting polymer layer is from about 1:0.5 to about 1:15.

13. The circuit board of claim 1 wherein the conductive foils have a thickness of from about 0.5 to about 200 microns.

14. The circuit board of claim 1 wherein the substrate comprises fiberglass, paper, polybenzoxolate paper, an etched circuit, semiconductor materials, or combinations thereof.

15. The circuit board of claim 1 wherein the substrate comprises a plurality of adjacent strata, wherein each stratum is attached to an adjacent stratum by a thermosetting polymer layer.

16. The circuit board of claim 1 wherein at least one of the electrically conductive foils comprises a part of an electrical circuit.

17. The circuit board of claim 1 wherein the composition of at least one of the thermoplastic or thermosetting layers is comprised of a filler wherein the filler is selected from the group consisting of barium titanate, boron nitride, aluminum oxide, silica, strontium titanate, barium strontium titanate, quartz, glass beads and combinations thereof.

18. A process for manufacturing a printed circuit board comprising:
   a) depositing a thermosetting polymer layer onto opposite surfaces of a substrate;
   b) depositing a thermoplastic dielectric layer onto each of the thermosetting polymer layers; and
   c) depositing an electrically conductive layer onto each of the thermoplastic dielectric layers wherein the thermoplastic dielectric layers comprise a material selected from the group consisting of polyesters, polyester containing copolymers, polyarylene ethers, polyimides, liquid crystal polymers, amines, and combinations thereof.

19. The process of claim 18 wherein the substrate, thermosetting polymer layers, thermoplastic dielectric layers and electrically conductive layers are absent of halogenated fire retardant additives.

20. The process of claim 18 wherein the substrate, thermosetting polymer layers, thermoplastic dielectric layers and electrically conductive layers are absent of bromine containing fire retardant additives.

21. The process of claim 18 wherein the electrically conductive foils comprise a material selected from the group consisting of copper, zinc, brass, chrome, nickel, aluminum, stainless steel, iron, gold, silver, titanium and combinations thereof.

22. The process of claim 18 wherein the thermoplastic dielectric layers comprise a polymide.

23. The process of claim 18 wherein the thermosetting polymer layers comprise a material selected from the group consisting of non-halogenated epoxies, bis-malimide triazine epoxies, thermosetting polyimides, cyanate esters, allylated polyphenylene ethers, benzocyclobutenes, phenolics and combinations thereof.

24. The process of claim 18 wherein the thermoplastic dielectric layers comprises a substantially nonflammable material as determined by the UL94V0 test.

25. The process of claim 18 wherein the composition of at least one of the thermoplastic or thermosetting layers is comprised of a filler wherein the filler is selected from the group consisting of ceramics, nonceramics and combinations thereof.

26. The process of claim 18 wherein each of the thermoplastic and thermosetting layers have a thickness of from about 5 to about 200 microns.

27. The process of claim 18 wherein the conductive foils have a thickness of from about 0.5 to about 200 microns.

28. The process of claim 18 wherein the substrate comprises fiberglass, paper, polybenzoxolate paper, an etched circuit, semiconductor materials, or combinations thereof.

29. The process of claim 18 wherein the substrate comprises a plurality of adjacent strata, wherein each stratum is attached to an adjacent stratum by a thermosetting polymer layer.

30. The process of claim 18 wherein at least one of the electrically conductive foils comprises a part of an electrical circuit.

31. The process of claim 18 wherein the thermoplastic dielectric layers or thermosetting polymer layers, or both, are applied as liquids.

32. The process of claim 18 wherein the thermoplastic dielectric layers or thermosetting polymer layers, or both, are applied as liquids and then at least partially dried.

33. The process of claim 18 wherein the composition of at least one of the thermoplastic or thermosetting layers is comprised of a filler wherein the filler is selected from the group consisting of barium titanate, boron nitride, aluminum oxide, silica, strontium titanate, barium strontium titanate, quartz, glass beads and combinations thereof.

* * * * *